United States Patent [19]

Henderson et al.

[11] Patent Number: 5,362,657
[45] Date of Patent: Nov. 8, 1994

[54] LATERAL COMPLEMENTARY HETEROJUNCTION BIPOLAR TRANSISTOR AND PROCESSING PROCEDURE

[75] Inventors: Timothy S. Henderson, Richardson; Donald L. Plumton; Han-Tzong Yuang, both of Dallas, all of Tex.;

[73] Assignee: Texas Instruments Incorporated, Dallas, Tex.

[21] Appl. No.: 180,753

[22] Filed: Jan. 10, 1994

Related U.S. Application Data

[63] Continuation of Ser. No. 982,096, Nov. 25, 1992, abandoned.

[51] Int. Cl.[5] .............................. H01L 21/265
[52] U.S. Cl. ............................. 437/31; 437/32; 437/133; 437/22; 148/DIG. 72
[58] Field of Search ............ 437/32, 133, 31, 126, 437/22, 24, 917; 148/DIG. 72, DIG. 96

[56] References Cited

U.S. PATENT DOCUMENTS

| | | | |
|---|---|---|---|
| 4,573,064 | 2/1986 | McLevige et al. | 148/DIG. 10 |
| 4,611,388 | 9/1986 | Pande | 437/133 |
| 4,936,781 | 6/1990 | Mircea et al. | 437/133 |
| 5,063,167 | 11/1991 | Shimura | 437/31 |
| 5,089,428 | 2/1992 | Verret et al. | 437/32 |
| 5,094,964 | 3/1992 | Hamasaki | 148/DIG. 72 |
| 5,098,853 | 3/1992 | Clark et al. | 437/31 |
| 5,164,797 | 11/1992 | Thornton | 372/45 |

*Primary Examiner*—Tom Thomas
*Assistant Examiner*—Tuan Nguyen
*Attorney, Agent, or Firm*—Rene Grossman; Richard L. Donaldson

[57] ABSTRACT

A method of fabricating a heterojunction bipolar transistor and the transistor by providing a substrate of a group III-V semiconductor material, doping a first selected region at a surface of the substrate a predetermined first conductivity type, concurrently or separately incorporating a group III element into a portion of the first selected region, doping the portion of the first selected region to a second conductivity type with a laser beam to cause melting and subsequent recrystallization of said substrate and forming contacts to the portion of the first selected region and to the first selected region. The portion of the first selected region extends farther into the substrate than the remainder of the first selected region. A complementary transistor can be concurrently fabricated using the same steps except that p-implants replace the n-implants and n-doped InGaAs instead of p-doped InGaAs forms the base layer. Complementary devices on the same wafer are provided relatively easily using selective implants and two separate InGaAs recrystallizations, one for a p-type base and the other for an n-type base. The fabrication of the pnp HBT entails masking of the npn HBT while performing operations unique to the pnp HBT and masking of the pnp HBT while performing operations unique to the npn HBT as is well known. Any complementary HBT circuit may then be realized.

16 Claims, 1 Drawing Sheet

LATERAL COMPLEMENTARY HETEROJUNCTION BIPOLAR TRANSISTOR AND PROCESSING PROCEDURE

This application is a continuation, of application Ser. No. 07/982,096, filed Nov. 25, 1992, now abandoned.

BACKGROUND OF THE INVENTION

1. Field of the Invention

This invention relates to a method of fabricating lateral, complementary heterojunction bipolar transistors (HBT) and the transistor.

2. Brief Description of the Prior Art

Prior art attempts to fabricate lateral, planar HBTs have met with only limited success. To date, there has been no known satisfactory demonstration of monolithic complementary lateral HBTs. Lateral bipolar transistor structures are commonplace in silicon technology, but not well developed in other materials systems, such as the group III-V devices and the Si/SiGe devices. An article of K. Taira et al. entitled "New Lateral GaAs Transistor", *Proceedings of IEDM*, page 201 (1984) relates to fabrication of lateral GaAs transistors, however the transistor is not a heterojunction device and the base width is relatively large (1.3 $\mu$m). Additionally, the current gain for this npn bipolar device is only 1. However, this approach allows for the easy fabrication of monolithic complementary circuits because the device active regions are formed by ion implantation.

In an article of P. Canfield et al. entitled "Lateral n-p-n Bipolar Transistors by Ion Implantation into Semi-insulating GaAs", *Solid-State Electronics*, Vol. 31, page 123 (1988), an improvement is provided wherein a lateral npn GaAs bipolar device is fabricated with a current gain of 50. This also is not a heterojunction device and has a base width of 1 $\mu$m which is unacceptably large for a high-speed device.

Articles of Yoo et al. entitled "InP/InGaAsP Heterojunction Bipolar Transistor by Selective Area Epitaxial Growth", *Electronics Letters*, Vol. 25, page 191 (1989) and "Fabrication and Characterization of Lateral InP/InGaAsP Heterojunction and Bipolar Transistors", *Applied Physics Letters*, Vol. 54, page 2318 (1989) show significant progress with the fabrication of an InP/InGaAsP lateral heterojunction bipolar transistor by selective area epitaxy to grow the emitter and collector structures. However, this process is cumbersome and, to date, has only resulted in transistors with current gains of 6 and base widths of 2 $\mu$m. Additionally, diffusion of the p-type donors from the base to the emitter and collector region occurs, resulting in a misalignment of the heterojunction and the electrical junction. Moreover, this process is poorly suited to the fabrication of monolithic complementary circuits, as this process would require a second regrowth.

A Thornton et al., article entitled "Unified Planar Process for Fabricating Heterojunction Bipolar Transistors and Buried-Heterojunction Lasers Utilizing Impurity-Induced Disordering", *Applied Physics Letters*, Vol. 53, page 2669 (1988), shows a process for fabrication of lateral GaAs/AlGaAs heterojunction bipolar transistors with current gains of 400 but low breakdown voltages (3 volts) and very high turn on voltages (about 10 volts) due to very high resistances in the collector and emitter. These device characteristics are unacceptable in integrated circuits. The fabrication process, which uses impurity induced disordering, is much better suited to the fabrication of monolithic laser/bipolar transistor circuits (its intended use) than it is to the fabrication of complementary circuits due to the large parasitic resistances involved and the necessity of regrowth to form both npn and pnp devices.

SUMMARY OF THE INVENTION

In accordance with the present invention, there is provided a method of fabricating lateral GaAs/InGaAs/GaAs HBTs not available in the prior art.

Initially, a semi-insulating GaAs substrate is ion implanted with a thin layer of n-type donors, most commonly and preferably silicon. Then, dielectric material, such as about 1000 to 4000 Å of $Si_3N_4$ or $SiO_2$, is deposited, followed by a thin layer, about 500 Å, of aluminum. Photolithography is then used to define the active base region and the aluminum and dielectric in this area is removed. Using electron beam lithography, a base region 1000 Å wide is defined. Indium is deposited on the entire layer in a sheet about 100 to 500 Å thick. The entire layer is then exposed to a short 10 to 200 nanosecond and preferably about 200 nanosecond, high intensity about 0.28 to about 0.61 $Jcm^{-2}$ ultraviolet (UV) laser light. The indium directly on top of the defined base region, in addition to the GaAs melt and recrystallize due to the heat produced by the laser light. The indium is incorporated into the base as the material recrystallizes. A p-type dopant, preferably dimethyl zinc, is incorporated into this layer from a prior implant, inclusion of a p-type dopant in the indium layer, or from an ambient gas during the laser exposure. During the melt and recrystallization, a portion of the substrate is also caused to melt and recrystallize, thereby causing the recrystallized p-type InGaAs region to extend into the substrate below the ion implanted n-type region.

The laser processing is described by Weiner and Sigmon in article entitled "Thin Base Bipolar Transistor Fabrication Using Gas Immersion Laser Doping", *IEEE Electron Device Letters*, EDL-10, page 260 (1989). The aluminum/dielectric material reflects the UV laser beam, so that the underlying material is unaffected. Moreover, as this is an extremely rapid process (the melt/regrowth process typically lasts under 200 nanoseconds in duration), no significant redistribution of atoms occurs outside the base region as these areas stay at ambient temperature because of the extremely short duration of the process.

Ohmic contacts to the base are deposited after the aluminum is etched off and are self-aligned to the base region because the dielectric layer serves as a mask. An n+ implant, or alternately, gas immersion laser doping is performed to increase surface donor concentration to facilitate good ohmic contact to the emitter and collector regions and the ohmic contacts are evaporated and lifted off in a non-critical alignment.

A pnp HBT is fabricated in a similar manner with p-implants replacing the n-implants in the above example and n-doped InGaAs instead of p-doped InGaAs forming the base layer. Finally, complementary devices on the same wafer are provided relatively easily using selective implants and two separate InGaAs recrystallizations, one for a p-type base and the other for an n-type base. The fabrication of the pnp HBT entails masking of the npn HBT while performing operations unique to the pnp HBT and masking of the pnp HBT while performing operations unique to the npn HBT as is well known. Any complementary HBT circuit may then be realized.

The above described procedure is unique in that it allows for the fabrication of monolithic complementary HBT circuits, this not having been previously accomplished. The HBTs have the further advantage of complete planarity and total isolation from one another without requiring etching and regrowth steps. Furthermore, the process applies a newly developed processing technique, laser recrystallization, to fabricate lateral heterojunction devices with truly submicron dimensions, this not having been previously accomplished.

The above described process has the advantage of being capable of fabricating narrow base devices. Using electron beam lithography, a base width of 0.1 μm or less can be defined with relative ease. This thickness is comparable to the base width in high-speed mesa structure epitaxially grown HBTs. Another advantage of the process is that the dopants and the In will be incorporated simultaneously into the substrate, resulting in minimal displacement of the electrical junctions and heterojunctions. Further, the above described technique has the advantage of "boxlike" profiles. It is essential that the In mole fraction and dopant concentration remain constant as a function of depth.

There are several critical features which must be present. First, the InGaAs layer and its dopant must extend depthwise below the shallow collector and emitter regions. If this is not the case, the emitter and collector will form a short circuit. This problem is compounded by the fact that InGaAs is not lattice matched to GaAs, which limits the depth of the base layer. Surface recombination is often a problem in GaAs-based devices and as most of the current in this lateral HBT is expected to be within several hundred angstroms of the surface, this may limit the current gain, to say nothing of surface depletion of the carriers. However, with the use of an InGaAs base, it can be expected that surface recombination will not be a major obstacle, as InGaAs has a relatively low surface recombination velocity.

The dopant distribution in the emitter and collector in the direction of transistor operation is more difficult to control. Typically, the collector is divided into two layers, the active n− region which controls the $BV_{cbo}$ breakdown characteristics and the n+ subcollector which is used to minimize the collector resistance. In this lateral HBT, the width of the n− must be large enough to maintain high breakdowns and to minimize the collector/base capacitance. Typical collector thickness and doping for HBTs are 6000 Å and $2 \times 10^{16}/cm^3$ for emitter-up devices and 3000 Å and $6 \times 10^7/cm^3$ for emitter-down devices. To attain IV characteristics similar to standard HBTs, then the 3000 to 6000 Å doping thickness requires very tight geometries, a self-aligned scheme or perhaps multiple laser anneals for the different layer requirements.

The process is very versatile and complementary HBT circuits can also be fabricated with the Si/SiGe, AlGaAs/InAlGaAs, InAlAs/InGaAlAs, GaSb/GaInAsSb, AlSb/GaSb, InP/InGaAsP, GaAs/GaAsSb, GaInP/GaAs and GaP/GaAsP materials systems, where the emitter and collector layers appear first and the smaller bandgap base material appears second. Moreover, this technique can be used to fabricate many different types of lateral heterojunction devices to great advantage. For instance, a further improvement on this process is to add a lateral surface light emitting diode on the same chip as complementary HBTs for optical input/output. For the case of a GaAs substrate with GaAs/InGaAs/GaAs complementary HBTs, an n-type region is implanted and a p-type region of AlGaAs recrystallized adjacent thereto. The p-type concentration is higher than the n-type to compensate the donors that would remain in the AlGaAs during recrystallization. A p-type dopant can be implanted into the adjacent GaAs to provide for a good ohmic contact. Light emitters can also be made out of the AlGaAs/InAlGaAs, InAlAs/InGaAlAs, GaSb/GaInAsSb, AlSb/GaSb, InP/InGaAsP, GaAs/GaAsSb and GaP/GaAsP materials systems in a similar manner. Due to the difficulty in fabricating double heterojunction light emitters in this manner, efficiency is low, although this is compensated by the surface emission of the light.

DESCRIPTION OF THE PREFERRED EMBODIMENT

Figure 1:
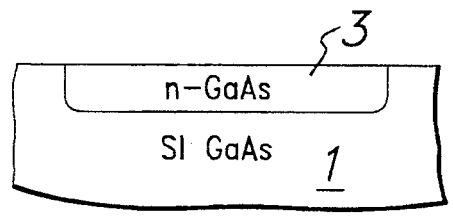
FIGS. 1 to 4 represent a process flow in accordance with the present invention showing a device at different stages of fabrication.
Figure 2:
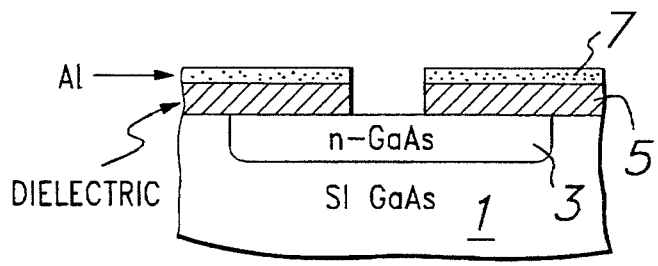
Figure 3:
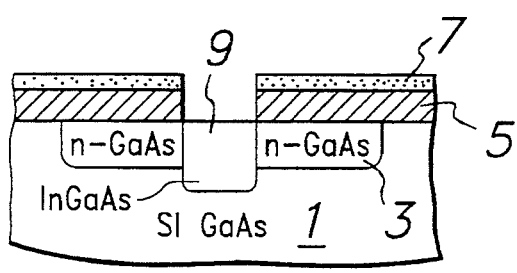

Referring first to FIG. 1, a semi-insulating GaAs substrate has a thin layer of n-type donors 3, most commonly and preferably silicon, implanted in a selected portion of the surface thereof. Then a dielectric material 5, such as about 1000 to 4000 Å of $Si_3N_4$ or $SiO_2$ and preferably 2000 Å, is deposited over the surface of the donor-implanted substrate, followed by a thin layer, about 500 Å, of aluminum 7. Photolithography is then used to define a 1000 Å wide active base region and the aluminum and dielectric in this area is removed in standard manner by removing the aluminum in HCl and dielectric $SiO_2$ in HF or plasma $CF_4/O_2$ or $CHF_3/O_2$ for $Si_3N_4$ as shown in FIG. 2. Indium is deposited on the entire exposed surface in a sheet about 100 to 500 Å thick. The entire surface with the indium layer thereon is then exposed to a short 10 to 200 nanosecond high intensity 0.28 to 0.61 $J/cm^2$ ultraviolet (UV) laser light. The indium directly on top of the defined base region, in addition to the GaAs therebeneath, melt and recrystallize due to the heat produced at the defined base surface by the laser light. The indium is incorporated into the base as the material recrystallizes to provide a base region which is now n-type InGaAs. A p-type dopant, preferably dimethyl zinc, is then incorporated into the base region from a prior implant or from inclusion of the p-type dopant in the indium layer or from an ambient gas during the laser exposure with melt and recrystallization to alter the base region from n-type InGaAs to p-type InGaAs 9 as shown in FIG. 3. Alternatively, a dopant such as Be or C can be used.

The laser processing is described by Weiner and Sigmon in article entitled "Thin Base Bipolar Transistor Fabrication Using Gas Immersion Laser Doping", *IEEE Electron Device Letters*, EDL-10, page 260 (1989). The aluminum/dielectric material reflects the UV laser beam, so that the material underlying the aluminum layer is unaffected. Moreover, as the laser melting step is an extremely rapid process (the melt/regrowth process typically lasts under 200 nanoseconds in duration), no significant redistribution of atoms occurs outside the base region. This is because the non-melted regions of the base stay at ambient temperature because of the extremely short duration of the process.

Ohmic contacts 11 to the base are deposited after the aluminum 7 is etched off in standard manner, the contacts 11 being self-aligned to the base region because the dielectric layer 5 serves as a mask for the base contact fabrication. The dielectric layer 5 is then patterned and etched to provide openings therein spaced from the base contact 11 and base region 9 and extending over a portion of the remaining n-GaAs region 3 and the substrate portion 1 adjacent to the region 3. An n+ implant 13, or alternately, gas immersion laser doping is performed to increase surface donor concentration to facilitate good ohmic contact to the emitter and collector regions and the ohmic contacts 15 are evaporated and lifted off in a non-critical alignment. This provides the npn HBT shown on the left portion of FIG. 4.

Figure 4:
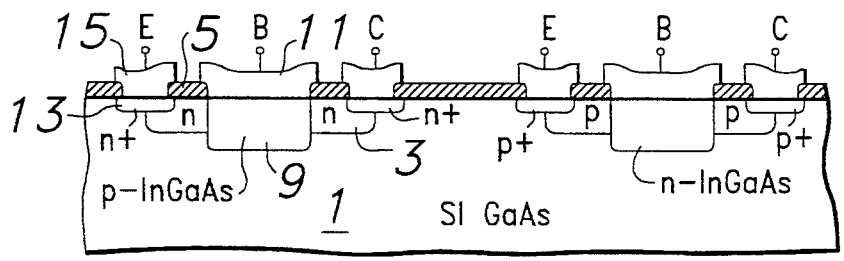

The pnp HBT, shown on the right portion of FIG. 4 is fabricated in a similar manner as described above with respect to the npn HBT with p-implants replacing the n-implants in the above example and n-doped InGaAs instead of p-doped InGaAs forming the base layer. Finally, complementary devices on the same wafer are provided relatively easily using selective implants and two separate InGaAs recrystallizations, one for a p-type base and the other for an n-type base. The fabrication of the pnp HBT entails masking of the npn HBT while performing operations unique to the pnp HBT and masking of the pnp HBT while performing operations unique to the npn HBT as is well known. Any complementary HBT circuit may then be realized.

Figure 5:
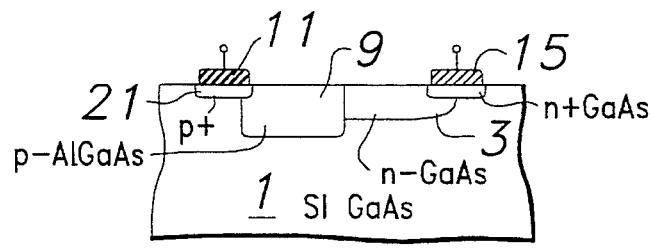
FIG. 5 represents an alternate embodiment of the process flow and transistor of FIGS. 1 to 4.

As shown in FIG. 5, a p-type dopant can be implanted into the adjacent GaAs to provide a p+ region 21 for a good ohmic contact to the base region 9 by the contact 11.

Though the invention has been described with respect to a specific preferred embodiment thereof, many variations and modifications will immediately become apparent to those skilled in the art. It is therefore the intention that the appended claims be interpreted as broadly as possible in view of the prior art to include all such variations and modifications.

We claim:

1. A method of fabricating a heterojunction bipolar transistor comprising the steps of:
   (a) providing a substrate of a group III-V semiconductor material;
   (b) doping a first selected region of said substrate extending to a surface of said substrate a predetermined first conductivity type;
   (c) doping a portion of said first selected region to provide a second conductivity type in said portion of said first selected region having a bandgap lower than the bandgap of said first selected region; and
   (d) forming contacts to said portion of said first selected region doped to a second conductivity type and to said first selected region external of said portion of said first selected region.

2. The method of claim 1 further including the step of causing said portion of said first selected region to extend farther into said substrate than the remainder of said first selected region.

3. The method of claim 2 wherein said step of causing said portion of said first selected region to extend farther into said substrate than the remainder of said first selected region comprises the step of heating said portion of said first selected region with a laser beam to cause melting and subsequent recrystallization of said substrate.

4. The method of claim 1 further including the steps of:

(e) doping a second selected region at a surface of said substrate a second conductivity type;
(f) doping a portion of said second selected region to said first conductivity type; and
(g) forming contacts to said portion of said second selected region and to said second selected region.

5. The method of claim 4 further including the steps of causing said portion of said first selected region to extend farther into said substrate than the remainder of said first selected region and causing said portion of said second selected region to extend farther into said substrate than the remainder of said second selected region.

6. The method of claim 5 wherein said steps of causing said portion of said first selected region to extend farther into said substrate than the remainder of said first selected region and causing said portion of said second selected region to extend farther into said substrate than the remainder of said second selected region comprises the step of heating said portions of said first and second selected regions with a laser beam to cause melting and subsequent recrystallization of said substrate.

7. The method of claim 6 wherein said substrate is gallium arsenide and said portion of said first selected region is indium gallium arsenide.

8. The method of claim 1 wherein said substrate is gallium arsenide and said portion of said first selected region is indium gallium arsenide.

9. A method of fabricating a heterojunction bipolar transistor comprising the steps of:
   (a) providing a substrate of a group III-V semiconductor material;
   (b) doping a first selected region at a surface of said substrate a predetermined first conductivity type;
   (c) incorporating a group III element into a portion of said first selected region;
   (d) doping said portion of said first selected region to a second conductivity type having a bandgap lower than the bandgap of said first selected region; and
   (e) forming contacts to said portion of said first selected region doped to a second conductivity type and to said first selected region external of said portion of said first selected region.

10. The method of claim 9 wherein steps (c) and (d) are performed concurrently with a laser beam to cause melting and subsequent recrystallization of said substrate.

11. The method of claim 10 further including the step of causing said portion of said first selected region to extend farther into said substrate than the remainder of said first selected region.

12. The method of claim 9 further including the step of causing said portion of said first selected region to extend farther into said substrate than the remainder of said first selected region.

13. The method of claim 9 further including the steps of:
   (f) doping a second selected region at a surface of said substrate a second conductivity type;
   (g) incorporating a group III element into a portion of said second selected region;
   (h) doping said portion of said second selected region to said first conductivity type; and
   (i) forming contacts to said portion of said second selected region and to said second selected region.

14. The method of claim 13 wherein steps (c) and (d) are performed concurrently with a laser beam to cause melting and subsequent recrystallization of said substrate and steps (g) and (h) are performed concurrently with a laser beam to cause melting and subsequent recrystallization of said substrate.

15. The method of claim 14 further including the step of causing said portion of said first selected region to extend farther into said substrate than the remainder of said first selected region and causing said portion of said second selected region to extend farther into said substrate than the remainder of said second selected region.

16. The method of claim 13 further including the step of causing said portion of said first selected region to extend farther into said substrate than the remainder of said first selected region and causing said portion of said second selected region to extend farther into said substrate than the remainder of said second selected region.

* * * * *